United States Patent [19]
Kataoka et al.

[11] Patent Number: 5,660,646
[45] Date of Patent: Aug. 26, 1997

[54] SOLAR BATTERY MODULE

[75] Inventors: Ichiro Kataoka, Tsuzuki-gun; Takahiro Mori, Ikoma; Satoru Yamada; Hidenori Shiotsuka, both of Tsuzuki-gun; Ayako Komori, Nara, all of Japan

[73] Assignee: Canon Kabushiki Kaisha, Tokyo, Japan

[21] Appl. No.: 551,963

[22] Filed: Nov. 2, 1995

[30] Foreign Application Priority Data

Nov. 4, 1994 [JP] Japan .................................. 6-271629

[51] Int. Cl.$^6$ .............................................. H01L 31/048
[52] U.S. Cl. ............................................ 136/251; 136/244
[58] Field of Search ...................................... 136/251, 244

[56] References Cited

U.S. PATENT DOCUMENTS 5,344,498  9/1994  Inoue ........................ 136/251
5,389,159  2/1995  Kataoka et al. ............. 136/251

OTHER PUBLICATIONS

Flat–Plate Solar Array Project Final Report, Oct. 1986, vol. 7, Module Encapsulation, E. Cuddihy et al.,"Electricity from Photovoltaic Solar Cells".

*Primary Examiner*—Aaron Weisstuch
*Attorney, Agent, or Firm*—Fitzpatrick, Cella, Harper & Scinto

[57] ABSTRACT

A solar battery module in which at least the front, light incident side of the photovoltaic elements is covered with a transparent organic polymer resin, and a resin film of a material different from the organic polymer resin, is inserted between at least one metallic member which interconnects adjacent elements and the organic polymer resin on the photovoltaic element.

25 Claims, 4 Drawing Sheets

SOLAR BATTERY MODULE

BACKGROUND OF THE INVENTION

1. Field of the Invention

The present invention relates to a solar battery module, particularly to a surface protecting member of the solar battery module which seals the light incident side of a photovoltaic element with a transparent organic polymer resin.

2. Description of the Related Art

In recent years, world wide interest in the preservation of the environment has occurred. In particular, as global warming with carbon dioxide emissions has given rise to serious concerns, the demands for clean energy sources have increased. At present, solar batteries are anticipated as being one of the clean energy sources due to their safety and ease of handling.

There are currently known various types of solar batteries. The following types are typical:

(1) Single crystal silicon solar batteries;

(2) Poly-crystal silicon solar batteries;

(3) Amorphous silicon solar batteries;

(4) Copper-indium selenide solar batteries; and (5) Compound semiconductor solar batteries.

Among them, thin film polycrystal silicon solar batteries, compound semiconductor solar batteries, and amorphous silicon solar batteries are relatively low in production cost. Research and development have recently been intensively carried out in a variety of areas.

Among these solar batteries, thin film solar batteries, typically amorphous silicon solar batteries where silicon is deposited on a conductive metal substrate and then transparent conductive film is formed thereon, are lightweight and exhibit excellent impact resistance and flexibility. It is apparent that solar batteries have bright future prospects in modular form. However, this type of solar battery must be protected from the environment by covering with a transparent sealing material on the light incident face, which differs from the case where silicon is deposited on a glass substrate.

Conventionally, as surface coating materials, transparent fluoride polymer thin films such as fluorine resin films and fluorine resin paint have been applied to the top surface, and various transparent thermoplastic resins have been used in the interior thereof. Because fluoride polymers have excellent weatherability and water repellent properties, they can reduce efficiency losses of the solar battery module due to decreasing light transmittance from yellowing or cloudiness of deteriorated resin or surface contamination. Further, transparent thermoplastic resins are inexpensive and may be used in great quantities as a filler to protect the photovoltaic element inside the module.

Moreover, to effectively output the generated power, metallic members electrically connect various collecting electrodes in series or in parallel. Each of the connecting members is contained within the solar battery module. The transparent thermoplastic organic resins have the advantage that the resin smooths the surface of the sealing material by removing the irregularities, thereby sealing the electrical connection members such as electrodes and metallic members.

Figure 6:
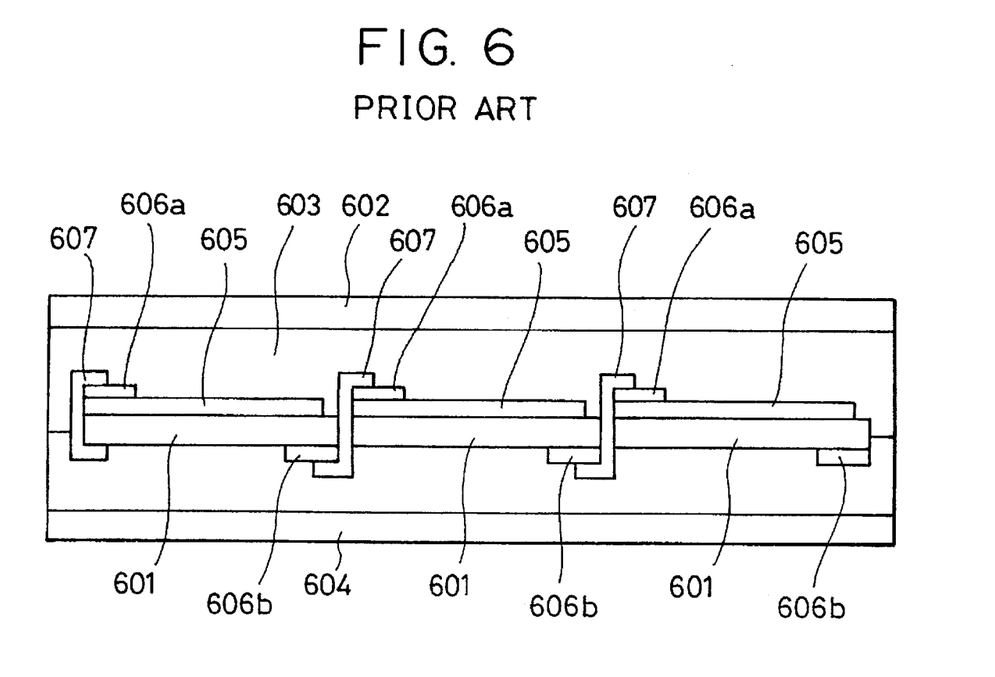
FIG. 6 is a schematic cross-sectional view showing an example of a conventional solar battery module.

FIG. 6 shows an example of such conventional solar batteries. In FIG. 6, 602 represents a fluoride polymer thin film, 603 represents a transparent thermoplastic organic resin, 601 represents a photovoltaic element, 604 represents an insulating layer, 605 represents a collecting electrode, 606(a) and 606(b) represent a terminal of each element, and 607 represents a metal foil which serially connects the elements via the terminals. The same organic resin used on the front face is also used on the reverse face. Examples of the resin used are fluorine resin films such as ETFE (ethylene-tetrafluoroethylene copolymer) film and PVF (poly vinyl fluoride), which are used as the fluoride polymer thin film; EVA (ethylene-vinyl acetate copolymer) and butyral resin are used as the transparent thermoplastic organic resin; various organic resin films such as nylon film, TEDLAR laminated aluminum foils and the like are used as the insulating layer; gold, silver, soldering materials, conductive pastes and the like are used as the collecting electrodes; and copper, silver, and solder plated copper are used as the metal foil. In example, transparent thermoplastic resin 603 not only functions as an adhesive between the photovoltaic element 601 and the fluorine resin film 602 or the insulating layer 604, but also as a filler for removing the irregularities on the surface of the element and protecting the solar battery from exogenous scratches and impacts.

However, in the conventional structure of the solar battery, the electrical connection members of the photovoltaic element, especially the metallic member, directly contact the transparent thermoplastic organic resin present as the filler. Thus, there is a drawback in that the deterioration of the resin contacting the metallic member is promoted and the metallic member is corroded due to the degradation products of the resin. Degradation of the sealing material often occurs after long-term exposure outdoors. That is, the disadvantages of the conventional structure reside in the promotion of the degradation process catalyzed by the metal and the corrosion of the metal due to acid. These phenomena are especially marked in the case where EVA is used as the transparent thermoplastic organic resin and copper is used as the metallic member. For example, the report of the Jet Propulsion Laboratory for the U.S. Department of Energy, "Flat-Plate Solar Array Project Volume VII: Module Encapsulation (1986)" describes that EVA which contacts copper in the module significantly yellows during 12,000 hours exposure with heating. This is confirmed by our heat resistance test of the module carried out at 150° C., where the yellowing of the EVA on the copper foil is extremely significant compared with other portions of the module.

Furthermore, during our weathering test of the module with a sunshine weathermeter carried out at the same time, a color change of the copper foil to green was observed. This occurrence is apparently due to promotion of the EVA degradation by catalysis of the copper, the corrosion of the copper with acetic acid as the degradation product of EVA, and their synergistic effects.

The above situation is not limited to the yellowing of the EVA on the copper foil. In severe cases, the yellowing of EVA will spread around the copper foil. Because the yellowed sealing material leads to a decreased quantity of light reaching the photovoltaic element, adverse effects such as the decreasing quantity of light which contributes to power generation and decreasing photoelectric conversion efficiency of the solar battery result when the region around the copper foil is a power generating region.

These drawbacks are further promoted when using the integrated module with a roof sheathing where the module temperature rises to a high value. The module temperature in this case is generally around 20° C. higher than in the case of modules having a frame, because there is no air flow across the reverse face. That is, no cooling effect is caused by the wind, different from when the solar battery module is placed on the frame. Such yellowing of the EVA on the copper foil will surely be promoted under this condition.

A different filler resin may be used instead of the EVA resin to avoid these drawbacks. Some resins having high durability such as silicone resin or fluorine resin, for example, have been suggested as substitutes for EVA. However, these resins can not be used due to the high cost of these resins, making it difficult to attain a low cost battery. On the other hand, EVA offers an excellent combination of durability and cost, and presents the best potential sealing material for the solar battery at the present time. Therefore, it would be very difficult to substitute other resins for the EVA.

The electrical connection members of the photovoltaic element are easily damaged due to external mechanical factors. Typically, in the case of a module structure where the top surface is a film as described above, hail impact resistance and scratch resistance of the electrical connection members having irregularities should be improved. A sufficient thickness of the sealing material is required to protect the electrical connection members. Further, the irregularities of the electrical connection members are much greater than the irregularities of the photovoltaic element, so that the electrical connection members including the smooth portions should be filled with great quantities of the resin for protection. This leads to cost increase and weight increase of the module.

SUMMARY OF THE INVENTION

An object of the present invention is to provide a highly reliable solar battery module in order to solve the above-mentioned problems. When the deterioration of the transparent organic polymer resin as the sealing material, which contacts with the metallic members connected to the photovoltaic element, is reduced, no appearance change is noted during long-term outside exposure, and decrease in photoelectric conversion efficiency does not occur.

A further object of the present invention is to provide protection of the electrical connection members from damage due to external mechanical factors by selective improvement of hail impact resistance and scratch resistance of the electrical connection members of the solar battery module when the surface is covered with a film.

The inventors of the present invention found the following to be the best means to solve the above-mentioned drawbacks after intensive research and development. The present invention is for a solar battery module comprising a plurality of photovoltaic elements, each of said photovoltaic elements comprising a conductive substrate, a photoactive semiconductor layer, and a transparent conductive layer on said substrate, a collecting electrode on said transparent conductive layer, a first output terminal electrically bonded to said conductive substrate and a second output terminal electrically bonded to said collecting electrode by a conductive paste or solder; the photovoltaic elements being electrically connected in series and/or parallel by means of metallic members connected to said first and second output terminals; and wherein:

at least the front, light incident side of each of said photovoltaic elements is covered with a transparent organic polymer resin; and a resin film comprising a material other than the transparent organic polymer is inserted between said metallic members and said transparent organic polymer resin.

Further objects, features and advantages of the present invention will become apparent from the following description of the preferred embodiments with reference to the attached drawings.

DETAILED DESCRIPTION OF THE PREFERRED EMBODIMENTS

Figure 1:
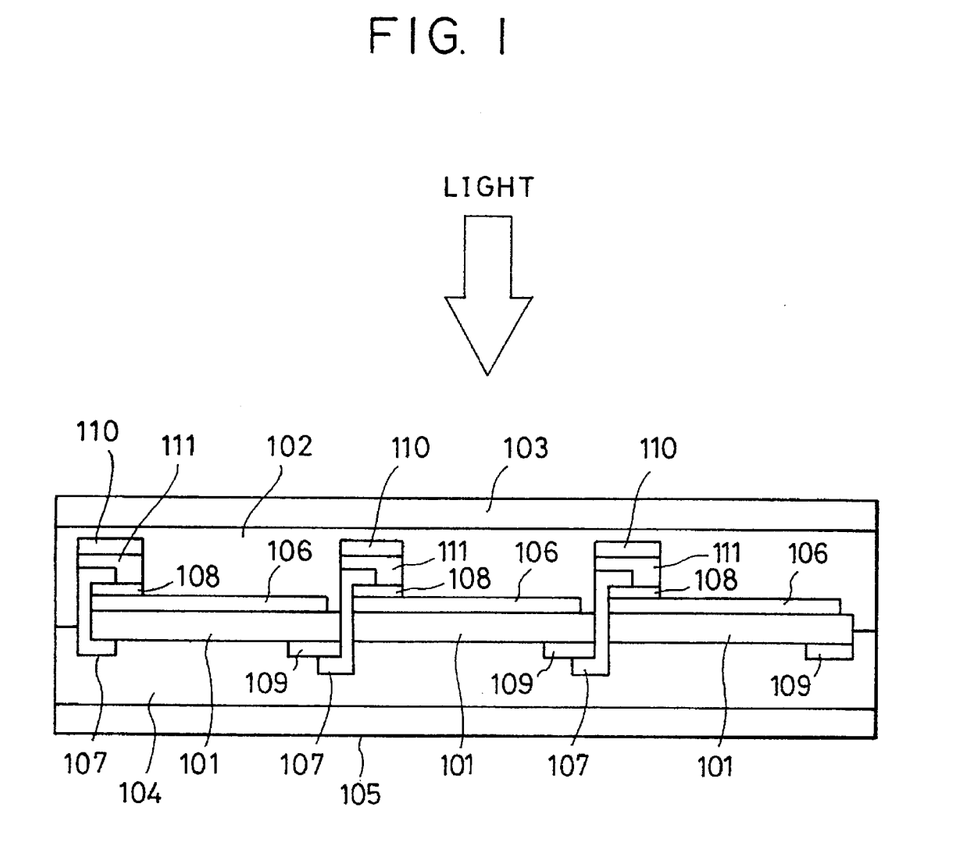
FIG. 1 is an example showing a schematic cross-sectional view of a solar battery module of the present invention.

FIG. 1 is a schematic cross-sectional view of a solar battery module of the present invention. In FIG. 1, 101 represents a photovoltaic element, 102 represents a front face transparent filler, 103 represents a transparent resin film covering the top surface, 104 represents a back face filler, 105 represents a back face covering film, 106 represents a collecting electrode, 107 represents a metallic member for connecting the elements in series, 108 represents a positive terminal attached to the element, 109 represents a negative terminal attached to the element, 110 represents a resin film, and 111 represents an adhesive layer, respectively. Incident light from the outside impinges on the transparent resin film covering the top surface 103 and reaches the photovoltaic element 101. The generated electromotive force is conducted outside through output terminals not shown in FIG. 1.

Figure 2A:
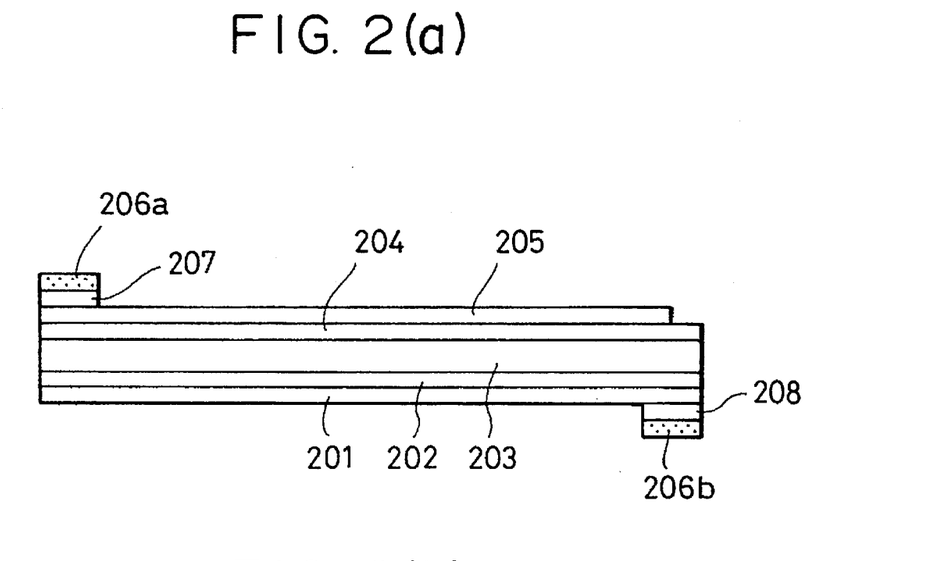
FIG. 2(a) is a schematic cross-sectional view showing a basic structure of a photovoltaic element.
Figure 2B:
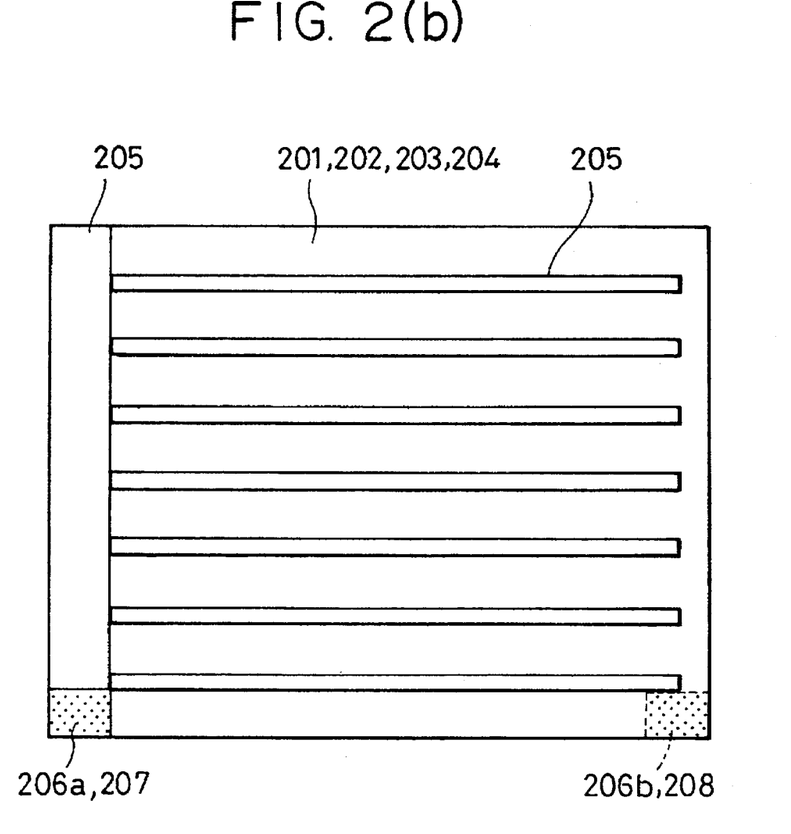
FIG. 2(b) is a plan view of the upper light incident face of the photovoltaic element module shown in FIG. 2(a)

The typical photovoltaic element 101 in the present invention comprises a photoactive semiconductor layer and a transparent conductive layer formed on a conductive substrate. An example is shown in FIGS. 2(a) and 2(b), where 201 represents a conductive substrate, 202 represents a rear face reflective layer, 203 represents a photoactive semiconductor layer, 204 represents a transparent conductive layer, 205 represents a collecting electrode, 206a and 206b represent output terminals, and 207 and 208 represent an adhesive layer connecting the output terminals to the collecting electrode 205 and the conductive substrate 201, respectively.

The conductive substrate 201 functions not only as the substrate of the photovoltaic element but also as the lower electrode. As the material used for the substrate, silicon, tantalum, molybdenum, tungsten, stainless steel, aluminum, copper, titanium, carbon sheet, lead plated steel sheet, and resin films and ceramics having conductive layer are suitable. On the conductive substrate 201, a metallic layer, metal oxide layer, or metal/metal oxide layer may be formed as the rear face reflective layer 202. As the metallic layer, Ti, Cr, Mo, W, Al, Ag, and Ni, for example, may be used, and as the metal oxide layer, ZnO, $TiO_2$, and $SnO_2$, for example, may be used. The metallic and metal oxide layers can be formed by resistance heating evaporation, electron beam evaporation, or sputtering.

The photoactive semiconductor layer 203 is the region where photoelectric conversion is performed, and pn junction poly crystalline silicon, pin junction amorphous silicon, compound semiconductors and heterojunctions such as $CuInSe_2$, $CuInS_2$, GaAs, $CdS/CU_2S$, CdS/CdTe, CdS/InP, and $CdTe/Cu_2Te$ may be used. As forming methods of the photoactive semiconductor layer, sheet formation from molten silicon or heat treatment of amorphous silicon for the poly crystalline silicon, plasma CVD of silane gas for amorphous silicon, and ion-plating, ion beam deposition, vacuum evaporation, sputtering, and electrolytic deposition for the compound semiconductors may be employed.

The transparent conductive layer 204 functions as the upper electrode of the solar battery. As the material usable for this layer, there are, for example, $In_2O_3$, $SnO_2$, $In_2O_3$—$SnO_2$(ITO), ZnO, $TiO_2$, $Cd_2SnO_4$, crystalline semiconductor layers doped with a high concentration of impurity, and the like. As the forming method, there are resistance heating evaporation, sputtering, spraying, CVD, impurity diffusion and the like.

A lattice-shaped collecting electrode or grid 205 may be placed on the transparent conductive layer 204 in order to effectively collect the electric power. As the material of the collecting electrode 205, there are, for example, Ti, Cr, Mo, W, Al, Ag, Ni, Cu, Sn, conductive paste such as silver paste, and the like. As a forming method of the collecting electrode 205, sputtering using a mask pattern, resistance heating, CVD, a patterning method where the unnecessary portions are removed by etching after forming a metal film on the whole surface via evaporation, plating after forming a negative mask pattern of the grid electrode, printing of a conductive paste, and the like. As the conductive paste, powdered silver, gold, copper, nickel, carbon and the like dispersed in a binder polymer may be used. As the binder polymer, there are, for example, resins such as polyester resin, epoxy resin, acrylic resin, alkyl resin, polyvinyl acetate resin, rubber, polyurethane resin, phenol resin, and the like.

Finally, the output terminals 206b and 206a are attached to the conductive substrate 201 and the collecting electrode 205, respectively, in order to output the generated electromotive force. The connection with the conductive substrate 201 is formed by bonding a metallic member such as a copper tab using spot welding or soldering, whereas the connection with the collecting electrode 205 is carried out by electrically bonding the metallic member using conductive paste or solder.

The photovoltaic elements made by the above-mentioned method are connected in series or in parallel according to the desired voltage or current. In the series connection, the positive terminal of one element is connected with the negative terminal of an adjacent element, whereas in the parallel connection, terminals having the same polarity are connected to each other. FIG. 1 shows the series connection as an example. In the example, the series connection was achieved by soldering the metallic member 107 and the positive terminal 108 of one element, and the metallic member 107 and the negative terminal 109 of the adjacent element. The desired voltage or current is obtainable by integrating the requisite number of photovoltaic elements on an insulated substrate.

As to the material of the metallic member used for the output terminal or for connection of the elements, it is preferably selected from the group consisting of copper, silver, solder, nickel, zinc, or tin, in consideration of high conductivity, good soldering ability, cost, etc.

The resin film 110 of the present invention is placed on the entire upper surface of the metallic member 107 and positive terminal 108. At the same time, the resin film is placed on the soldered portion of the metallic member for the series connection of the element. In FIG. 1, although the resin film is placed through the adhesive layer 111, the adhesive layer can be eliminated. As the resin film material, polyethylene terephthalate (PET), nylon resin, polycarbonate resin, polyethylene, polypropylene, polyvinyl chloride, acrylic resin and the like may be used. Although the thickness of the film is not particularly limited, it is preferred to be as thin as possible within the range able to maintain excellent hail impact resistance and scratch resistance of the metallic member. This is possible because the resin film is further covered with a filler. Preferable results can be achieved by using, for example, a film 10 µm to 200 µm in thickness.

As the adhesive resin, any well-known resin such as acrylic resin, polyamide resin, polychloroprene rubber, butyl rubber, nitrile rubber, phenol resin, melamine resin, epoxy resin, silicone resin, and the like may be used. However, acrylic resin or silicone resin having excellent weatherability is preferably used in order to stably maintain the initial adhesive strength after outdoor exposure of the solar battery module for a long time. An acrylic adhesive comprising a copolymer of butyl acrylate and 2-ethylhexyl acrylate as the major component is most suitably used. The thickness of the adhesive layer is preferably 10 µm to 100 µm, more preferably 30 µm to 50 µm. A thickness of less than 10 µm does not offer sufficient adhesive strength, whereas a thickness of more than 100 µm often causes separation inside the adhesive layer due to cohesive failure.

In order to prevent deterioration of the resin film layer and the adhesive resin layer by light, the light transmittance of the resin film alone (i.e. when not using the adhesive layer), or the combined light transmittance of the resin film and the adhesive resin layer is preferably 5% or less, particularly 3% or less, for all wavelengths ranging from 400 nm to 800 nm. When the transmittance is over 5%, yellowing and embrittlement of the resin film mainly due to ultraviolet light often occurs, and in the case where the adhesive layer is used, decreasing tackiness and increasing yellowing often appear because of deterioration caused by the light. Moreover, such a high transmittance will not provide a good appearance, because the metallic members can be seen through the resin film.

To decrease the light transmittance of the resin film or adhesive resin layer, mixing and dispersion of an opaque powder such as carbon black, or an inorganic oxide such as $Al_2O_3$ or $TiO_2$ may be used.

The surface resin film 103 and the front face filler 102 used in the present invention will now be explained in detail.

It is essential for the front face filler 102 to cover the irregularly shaped photovoltaic element, to protect the element from severe environmental factors such as temperature change, high humidity, impact, and to maintain the adhesion between the surface film and the element. Therefore, improved weatherability, adhesion, filler ability, heat resistance, cold resistance, and impact resistance are required for the filler. As resins having these properties, there are, for example, polyolefinic resins such as ethylene-vinyl acetate copolymer (EVA), ethylene-methyl methacrylate copolymer (EMA), ethylene-ethyl acrylate copolymer (EEA), butyral resin, polyurethane resin, silicone resin, and the like. Among them, EVA has well-balanced properties for use in the solar battery, and is preferably used. However, since an untreated EVA having a low deformation temperature is known to experience deformation or creep when used at a high temperature, it is desirable that the EVA be cross-linked to increase heat resistance. EVA is generally cross-linked with an organic peroxide.

The cross-linking with the organic peroxide is produced by the process whereby free radicals generated from an organic peroxide extract the hydrogen atoms or halogen atoms from the resin to form C—C bonds. The organic peroxide can be activated by thermal decomposition, redox decomposition, or ion decomposition, with the thermal decomposition being preferably used. The organic peroxide may be, for example, hydroperoxide, dialkyl peroxide, diallyl peroxide, diacyl peroxide, peroxyketal, peroxyester, peroxycarbonate, ketoneperoxide, and the like. The organic peroxide is added from 0.5 to 5 parts by weight per 100 parts by weight of the filler resin.

If the organic peroxides are used, cross-linking and heat sealing can be carried out while heating under pressure. The temperature and time of the heating are determined based on the heat decomposition properties of the organic peroxide used. In general, heating under pressure is completed when the heat decomposition proceeds over 90%, preferably over 95%.

For effective cross-linking, using triallylisocyanurate (TAIC) as the cross-linking activator is preferable. The activator is usually added from 1 to 5 parts by weight per 100 parts by weight of the filler resin.

Although the filler material used in the present invention offers excellent weatherability, an ultraviolet absorbing agent may be used for further improvement of the weatherability and the protection of the lower layer of the filler. Although any conventional compound may be used as the ultraviolet absorbing agent, a low volatility ultraviolet absorbing agent is preferably used, taking into consideration the service requirements of the solar battery module. The combined use of the light stabilizer with the ultraviolet absorbing agent provides further light stability to the filler.

An antioxidant may also be added to the filler for improvement in heat resistance.

In the case where the solar battery is used under even more severe circumstances, improved adhesion between the filler and the photovoltaic element or the surface film is desired. The adhesion can be improved by the addition of a silane coupling agent or organic titanate compound to the filler. The suitable amount added is 0.1 to 3 parts by weight, preferably 0.25 to 1 part by weight per 100 parts by weight of the filler resin.

However, the surface filler should be transparent to minimize the decrease in the amount of light which reaches the photovoltaic element. A suitable transmittance factor is 80% or more, preferably 90% or more in the visible light region ranging from 400 nm to 800 nm. Moreover, for facilitating incidence of the light from the atmosphere, the suitable refraction index of the surface filler is 1.1 to 2.0, preferably 1.1 to 1.6 at 25° C.

Since the surface resin film 103 in the present invention is placed on the top surface of the solar battery module, the resin film should provide properties such as weatherability, contamination resistance, and mechanical strength, to maintain long-term reliability during outdoor exposure of the solar battery. Suitable resin film materials used in the present invention are, for example, fluorocarbon resin, and acrylic resin. Between them, the fluorocarbon resin is preferably used due to its excellent weatherability and contamination resistance. Examples of the fluorocarbon resin are polyvinylidene fluoride resin, polyvinyl fluoride resin, and tetrafluoroethylene-ethylene copolymer. Although the polyvinylidene fluoride resin has excellent weatherability properties, the tetrafluoroethylene-ethylene copolymer is excellent for compatibility of weatherability and mechanical strength, and transparency.

The surface resin film should have sufficient thickness to maintain the mechanical strength, whereas a lesser thickness is desirable when considering the production cost of the solar battery module. The suitable thickness is 10 to 200 μm, preferably 30 to 100 μm.

Any surface treatment such as corona discharge treatment, plasma discharge treatment, ozone treatment, ultraviolet irradiation, electron beam irradiation, flame treatment, and the like is preferably conducted on the surface of the resin film in order to improve the adhesion with the filler.

The back face covering film 105 is necessary to provide electric insulation between the conductive substrate of the photovoltaic element 101 and the outside. The film material must ensure sufficient electric insulation with the conductive substrate, and have excellent flexibility to overcome the repeated heat expansion and contraction which takes place during long-term use. Nylon and polyethylene terephthalate are preferably used.

The back face filler 104 should be placed so as to bond the photovoltaic element 101 to the back face covering film. The properties required of the material used are sufficient adhesion with the conductive substrate, excellent long-term durability, and great flexibility to overcome the repeated heat expansion and contraction. As preferable materials, there are hot melt resins such as EVA, polyvinyl butyral, double-faced adhesive tape, and flexible epoxy resin adhesive. When the solar battery module is used in a high temperature environment, as for example, when integrated with roof sheathing, the cross-linking of the film is desirable for providing adhesion at a high temperature. As a cross-linking method of EVA and the like, the method using an organic peroxide is generally used.

Any reinforcement sheet may be attached to the outside of the back face covering film for the purpose of increasing mechanical strength or the prevention of distortion and warpage due to temperature change. For example, steel sheet, plastic sheet, and FRP (fiber reinforced plastic) are preferably used.

A method of making the solar battery module using the above-mentioned photovoltaic element, resin film, filler, and surface resin film will be explained as follows.

The resin film is formed on the metallic member of the photovoltaic element. When the resin film has an adhesive layer, the resin film can be fixed on the metallic member with the adhesive layer. When the film has no adhesive layer, the resin film may be placed on the metallic member in the following covering process. In covering the light incident face of the photovoltaic element with the filler 102, generally the filler is in sheet form and is heat-sealed on the photovoltaic element; i.e. the solar battery module is formed by heat-sealing after inserting the filler sheet between the photovoltaic element 101 and the top surface resin film 103. The heating temperature and time for the heat sealing will be determined in order to ensure that the cross-linking will proceed in a desirable manner. As for the heat sealing method, the conventional methods such as vacuum lamination, roll lamination, and the like may be used.

Similarly, the back face is also covered with the back face covering film and the back face filler. In general, since the front face filler and the back face filler are of the same material, the same covering process described above may also be used.

The present invention will be explained based on the examples described below.

EXAMPLE 1

Photovoltaic Element

First, an amorphous silicon (a-Si) photovoltaic element is produced. The procedure will be explained using FIGS. 2(a) and (b).

As the backside reflective layer 202, an Al layer of 5,000 Å in thickness and ZnO layer of 5,000 Å in thickness were separately formed on a cleaned stainless steel substrate 201. Then, by the plasma CVD method, n-type a-Si layers were formed from a mixture of $SiH_4$, $PH_3$, and $H_2$ gasses, i-type a-Si layers were formed from a mixture of $SiH_4$ and $H_2$ gasses, and p-type micro-crystal μc-Si layers were formed from a mixture of $SiH_4$, $BF_3$, and $H_2$ gasses. A tandem-type a-Si photoactive semiconductor layer 203 having an n-layer of 150 Å in thickness/i-layer of 4,000 Å/p-layer of 100 Å/n-layer of 100 Å/i-layer of 800 Å/p-layer of 100 Å was formed using the above process. The transparent electrode 204 was formed on the photoactive semiconductor layer 203 by depositing an $In_2O_3$ thin film of 700 Å thickness by resistance heating evaporation using In and an $O_2$ atmosphere. Then, after the collecting grid electrode 205 was formed by screen printing a silver paste, a copper tab as a negative terminal 206b was attached to the stainless steel substrate 201 with a stainless solder 208 and a tin foil tape as a positive terminal 206a was attached to the collecting electrode 205 with a conductive adhesive 207. A photovoltaic element having output terminals 206(a) and 206(b) was thus produced.

Solar Battery Array

Figure 3:
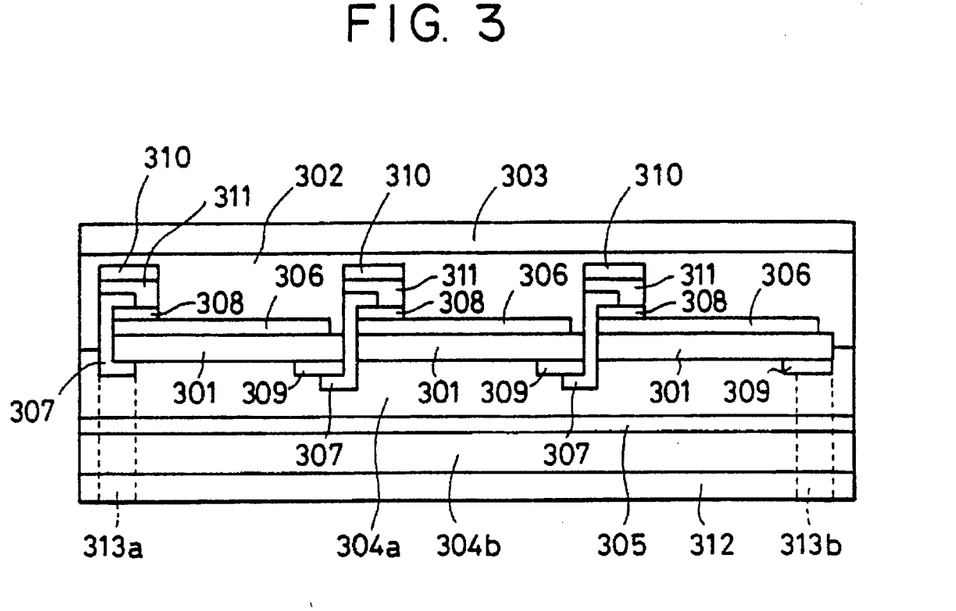
FIG. 3 is a schematic cross-sectional view of a solar battery module of Example 1.

A method making a solar battery array by connecting in series the above elements will be explained by using in FIG. 3.

After arranging each element, the positive terminal 308 of one element and the negative terminal 309 of an adjacent element are connected with copper tab 307 by soldering. In this way, a solar battery array having three elements connected in series was obtained. The copper tab connected to the output terminal at the end was turned towards the reverse side to output the output through a hole in the back side as mentioned below.

Then, a black PET film tape 310 (made by Toray, LUMIRROR X30, 50 μm in thickness) as a resin film was attached to the entire surface of the metallic members on the light incident face of the solar cell array connected in series, i.e., the positive terminal and the copper tab for series connection, using an acrylic adhesive 311 (made by 3M, commercial name VHB). The combined light transmittance of the resin film and the adhesive at typical wavelengths are shown in Table 1 with other examples, where the transmittance without adhesive layer means only the resin film.

TABLE 1

| | Combined light transmittance of the resin film + adhesive layer | | | | |
|---|---|---|---|---|---|
| | Wavelength | | | | |
| | 400 nm | 500 nm | 600 nm | 700 nm | 800 nm |
| Example 1 | 0.1% | 0.4% | 0.8% | 1.5% | 2.5% |
| Example 2 | 0.1% | 0.4% | 0.9% | 1.7% | 2.7% |
| Example 3 | 84.7% | 86.8% | 88.2% | 88.5% | 88.6% |
| Example 4 | 1.2% | 1.4% | 1.7% | 1.8% | 1.9% |

TABLE 1-continued

| | Combined light transmittance of the resin film + adhesive layer | | | | |
|---|---|---|---|---|---|
| | Wavelength | | | | |
| | 400 nm | 500 nm | 600 nm | 700 nm | 800 nm |
| Example 5 | 0.2% | 0.6% | 1.2% | 2.2% | 3.8% |
| Example 6 | 0.1% | 0.2% | 0.4% | 0.8% | 1.3% |
| Example 7 | 0.1% | 0.3% | 0.6% | 1.2% | 1.6% |
| Example 8 | 0.1% | 0.4% | 0.8% | 1.5% | 2.5% |
| Example 9 | 0.1% | 0.4% | 0.8% | 1.5% | 2.5% |

Module Formation

A solar battery module was made by superposing an EVA sheet 302 (made by Springborn Laboratories, trade name PHOTOCAP, 460 μm in thickness) and a corona discharge treated uniaxial stretched ETFE film 303 (made by DuPont, trade name TEFZEL T2 film, 38 μm in thickness) on the light incident face of the cell array, and EVA sheets 304a, 304b (made by Springborn Laboratories, trade name PHOTOCAP, 460 μm in thickness), a nylon film 305 (made by DuPont, trade name DARTEK, 63.65 μm in thickness), and a black coated galvanized steel plate 312 (0.27 mm in thickness) on the back face in the order of ETFE 303/EVA 302/cell array/EVA 304a/nylon 305/EVA 304b/steel plate 312, and heating at 150° C. for 30 minutes with degassing in a vacuum laminating device. The EVA sheet used in the example is commonly used as a sealant of solar batteries. The vinyl acetate content of the EVA is 33%, and the EVA is compounded with 1.5 parts by weight of cross-linking agent, 0.3 parts by weight of ultraviolet absorbent, 0.1 parts by weight of light stabilizer, 0.2 parts by weight of antioxidant, and 0.25 parts by weight of silane coupling agent per 100 parts by weight of EVA. The output terminals which had been previously turned towards the back side of the photovoltaic element were located at the terminal outlets 313a and 313b previously bored in the galvanized plate to receive the output terminals through holes formed in the back side after lamination.

The solar battery module was evaluated in accordance with the tests described later.

EXAMPLE 2

A solar battery module was prepared in a similar way as EXAMPLE 1, but adhesive for fixing the resin film was not used.

EXAMPLE 3

A solar battery module was prepared in a similar way as EXAMPLE 1, but the black PET resin film 310 was substituted by a transparent PET film.

EXAMPLE 4

A solar battery module was prepared in a similar way as EXAMPLE 1, but a white PET film 310 was used as the resin film and the galvanized plate was of a white color.

EXAMPLE 5

A solar battery module was prepared in a similar way as EXAMPLE 1, but the black PET resin film 310 was substituted by a black nylon film of 50 μm in thickness.

EXAMPLE 6

A solar battery module was prepared in a similar way as EXAMPLE 1, but the black PET resin film 310 was substituted by a black polycarbonate film of 50 μm thickness.

EXAMPLE 7

A solar battery module was prepared in a similar way as EXAMPLE 1, but the black PET resin film 310 was substituted by a black acrylic resin film of 50 μm thickness.

EXAMPLE 8

A solar battery module was prepared in a similar way as EXAMPLE 1, but a polyvinyl butyral resin was used instead of the EVA as the filler resin 302 and 304 of the front face and the back face.

EXAMPLE 9

Figure 4:
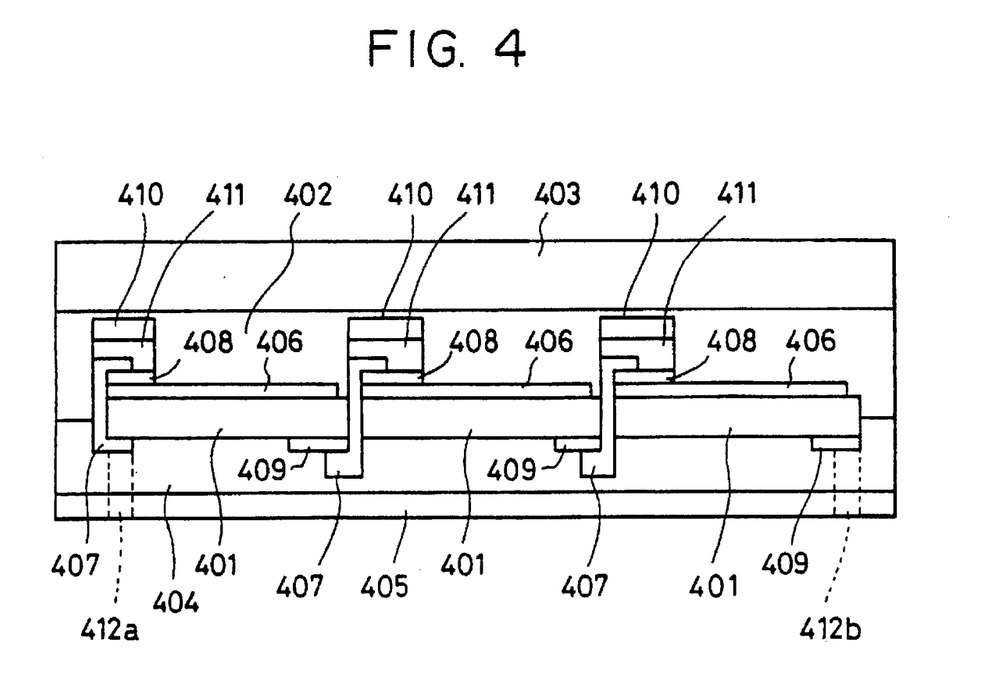
FIG. 4 is a schematic cross-sectional view of a solar battery module of Example 9.
Figure 5:
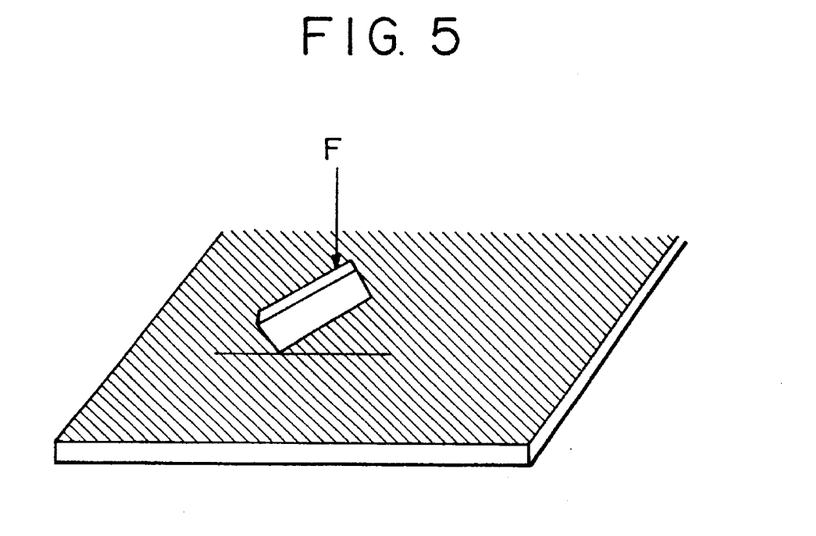
FIG. 5 is a schematic diagram showing the scratch resistance test.

A solar battery module was prepared in a similar way as EXAMPLE 1 through the array formation process, but the following module formation process explained with reference to FIG. 4 was performed.

Module Formation

A solar battery module was made by superposing an EVA sheet 402 (made by Springborn Laboratories, trade name PHOTOCAP, 800 μm in thickness) and a reinforced low-iron glass 403 (made by AFG, trade name SOLATEX, 3.2 mm in thickness) on the light incident face of the cell array, and EVA sheet 404 (made by Springborn Laboratories, trade name PHOTOCAP, 460 μm in thickness), and TEDLAR laminated aluminum foil 405 (made by Tokai Aluminum Foil) on the back face in the order of glass 403/EVA 402/cell array/EVA 404/TEDLAR laminated aluminum foil 405, and heating at 150° C. for 30 minutes with degassing in a vacuum laminating device. The output terminals which had been previously turned towards the back side of the photovoltaic element were located at the terminal outlets 412a and 412b previously bored in the TEDLAR laminated aluminum foil to receive the output terminals through the holes formed in the back side after lamination. The reference numerals in FIG. 4 correspond to the reference numerals identified in FIG. 3.

COMPARATIVE EXAMPLE 1

A solar battery module was prepared in a similar way as EXAMPLE 1, but the resin film layer 410 and the adhesive layer 411 were not formed on the metallic member.

COMPARATIVE EXAMPLE 2

A solar battery module was prepared in a similar way as EXAMPLE 8, but the resin film layer 410 and the adhesive layer 411 were not formed on the metallic member.

COMPARATIVE EXAMPLE 3

A solar battery module was prepared in a similar way as EXAMPLE 9, but the resin film layer 410 and the adhesive layer 411 were not formed on the metallic member.

The solar battery modules described in the above EXAMPLES and COMPARATIVE EXAMPLES were evaluated in accordance with the following tests. The results are shown in Table 2.

(1) Light stability

The solar battery modules were placed into an ultra energy irradiation testing machine (made by Suga Shikenki), and subjected to a dew cycle test. The modules were repeatedly subjected in turn to ultraviolet irradiation for 5 hours using a metal halide lamp, where the intensity was 100 mW/cm$^2$, the wavelength range was 300 to 400 mm, the temperature was 70° C. and the humidity was 70% RH, and a dew condensation for 1 hour, where the temperature was 30° C. and the humidity was 96% RH. The changes in appearance were observed after 2,000 hours. In Table 2, no change is expressed as N.C., and the change is briefly described for samples exhibiting any change.

(2) Weatherability

The solar batteries were placed into a sunshine weather-meter and subjected to an accelerated weatherability test by alternately repeating a cycle of light irradiation with a xenon lamp and rainfall. The changes in appearance were observed after 5,000 hours. In Table 2, no change is expressed as N.C., and the change is briefly described for samples having any change.

(3) Heat stability

After the solar batteries were allowed to stand for 3,000 hours in an atmosphere at 90° C., the changes in appearance were observed. In Table 2, no change is expressed as N.C., and the change is briefly described for samples exhibiting any change. Furthermore, the conversion efficiency was evaluated as the ratio of the conversion efficiencies before the test and after the test using an artificial sunlight source of AM 1.5.

(4) Scratch resistance

The most irregular portion of the module surface on the metallic member was scratched with carbon steel plate of 1 mm in thickness under 2 pounds of load to evaluate whether the covering material at the surface can maintain electric insulation after the scratching. The module was then immersed in an electrolyte solution having 3,000 Ω.cm of electrical resistivity. If the leakage current exceeded 50 μA when 2,200 volts was applied between the element and the solution, it was judged to be a failure. In Table 2, the accepted samples are expressed as Good, and the failed samples are expressed as N.G., respectively.

TABLE 2

Test results of solar battery module

| | | | Heat stabilities | | |
|---|---|---|---|---|---|
| | Light stability | Weatherability | Appearance | Relative conversion efficiency (before test = 1) | Scratch resistance |
| Example 1 | N.C. | N.C. | N.C. | 1 | Good |
| Example 2 | N.C. | N.C. | N.C. | 1 | Good |
| Example 3 | Slightly yellowed adhesive layer on copper | N.C. | N.C. | 1 | Good |
| Example 4 | N.C. | N.C. | N.C. | 1 | Good |
| Example 5 | N.C. | N.C. | N.C. | 1 | Good |
| Example 6 | N.C. | N.C. | N.C. | 1 | Good |
| Example 7 | N.C. | N.C. | N.C. | 1 | Good |
| Example 8 | N.C. | N.C. | N.C. | 1 | Good |
| Example 9 | N.C. | N.C. | N.C. | 1 | NA |
| Comparative Example 1 | Copper corroded | Copper corroded | Drastically yellowed EVA on copper | 0.95 | N.G. |
| Comparative Example 2 | Copper corroded | Copper corroded | Drastically yellowed polyvinyl butyral resin on copper | 0.94 | N.G. |
| Comparative Example 3 | N.C. | N.C. | Yellow EVA on copper | 0.98 | NA |

*NA: Not available N.C.: Not changed N.G.: No good

Table 2 clearly shows that the solar battery modules of the Examples of the present invention were extremely reliable, since the filler resin showed hardly any coloring during the light stability, weatherability, and heat stability tests. No change was observed from each module when a black or a white opaque film was placed on the metallic member. In the module of Example 3, although slight yellowing occurred during the light stability test due to deterioration by light, this sample is more reliable than the samples of the Comparative Examples because no change was observed during the weatherability test and the heat stability tests. Moreover, the module covered with the resin film on the top surface has no problem with respect to scratch resistance. An additional effect obtained when the metallic member is hidden by the opaque resin film placed on the metallic member in a module is excellent in appearance. By using a resin film having the same color as the back face steel plate, the effect is enhanced because the resin film is not noticeable.

In contrast, every Comparative Example shows considerable yellowing of the filler resin on the metallic member during the heat stability tests. Comparative Examples 1 and 2 having the film at the top surface particularly show remarkable yellowing, specifically in the power generation area, so that the photovoltaic efficiency decreases after the test. Further, in Comparative Example 1 and 2, the metallic member, especially copper, turned green in color due to the corrosion occurring during the light stability test and the weatherability test. These samples show poor scratch resistances; therefore, the insulation of the surface covering material is damaged after scratching on the metallic members. Moreover, these samples do not display good appearance because the metallic members can be seen.

A solar battery module according to the present invention has the following effects:

(1) The deterioration of the organic polymer resin on the metallic members or the corrosion of the metallic members caused by the organic polymer resin can be prevented. Namely, the yellowing of the resin on the metal and the corrosion of the metal, which are caused by the contact between the metallic members and the organic polymer resin, will not occur during longterm outdoor exposure.

(2) The metallic members can be protected from outdoor mechanical factors. A solar battery module having the top surface covered with a film has improved hail impact resistance and scratch resistance of the metallic members which are easily damaged due to the irregularity of the module.

(3) Moreover, by using butyral resin or ethylene-vinyl acetate copolymer (EVA) as the major component of the organic polymer resin, the above-mentioned effects can be achieved without major modification of the currently used components of the sealing materials, because these resins have been most commonly used as sealing materials of a solar battery module.

(4) No specific metal is required in the case where the surface of the metallic member comprises a metal selected from the group of copper, silver, a solder, nickel, zinc, or tin. A metallic member commonly used for interconnecting the photovoltaic elements can be used.

(5) The effect of the present invention can be achieved at a low cost, by choosing a resin selected from the group consisting of polyethylene terephthalate (PET), nylon resin, polycarbonate resin, polyethylene, polypropylene, polyvinyl chloride, and acrylic resin. The object of the present invention can be achieved without any drastic increase of material cost by using any inexpensive common resin film.

(6) The deterioration of the resin film by light can be prevented, when the light transmittance of the resin film is 5% or less for wavelengths ranging from 400 nm to 800 nm. Light stability increases because light cannot reach the inside of the resin film. Therefore, the resin film will retain its properties in the present invention during long-term outdoor exposure. The solar battery module has a good appearance because the interconnection member is not visible due to the hidden metallic member.

(7) Slippage between the metallic member and the resin film can be prevented by using an adhesive resin layer between the resin film and the metallic member. After the resin film is fixed on the metallic member with the adhesive resin, the coating material layer can be formed thereon, so that alignment between the metallic member and the resin film is maintained. Furthermore, the resin film can be securely placed on the metallic member, because the resin film does not slide off or detach from the metallic member.

(8) The deterioration of the adhesive layer by light can be prevented as well as a similar effect as described above in item (6), when the combined light transmittance of the resin film and the adhesive resin layer is 5% or less for all wavelengths ranging from 400 nm to 800 nm. There was no observation of deterioration of the adhesive resin promoted by light that causes separation due to decreased adhesive strength.

(9) Contamination of the surface of the solar battery module can be decreased during long-term outdoor exposure by placing a transparent resin film layer on the top surface of the organic polymer resin so as to directly contact the organic polymer resin.

(10) The coating has excellent weatherability resulting from using a fluoride polymer as the resin film. The good weatherability of the fluoride polymer as well as organic polymer resin as a filler can be expected.

(11) The excellent weatherability, high transparency, and high mechanical strength of the coating are demonstrated by using tetrafluoroethylene-ethylene copolymer as the fluoride polymer.

(12) The solar battery module can provide excellent flexibility in the case where the photovoltaic element comprises a photoactive semiconductor layer and a transparent conductive layer formed on a conductive substrate as a light conversion member. Because the photovoltaic element itself has excellent flexibility, a flexible solar battery module is easily producible by the combination with a flexible coating material.

In particular, the solar battery module in accordance with the invention, in which at least the front, light incident side of the photovoltaic element is covered with a transparent organic polymer resin comprising a material other than an organic polymer resin film inserted between at least one metallic member and the transparent organic polymer resin on the photovoltaic element, has the effects of preventing the problem of deterioration of the resin which contacts the metallic interconnection members of the module, and no change in appearance is noted during long-term outside exposure, and decreasing photoelectric conversion efficiency does not occur. Furthermore, the interconnection members can be protected from damage due to external mechanical factors by means of the selective improvement of the hail impact resistance properties and the scratch resistance of the interconnection members of the solar battery module where the surface is covered with film.

While the present invention has been described with reference to what are presently considered to be the preferred embodiments, it is to be understood that the invention is not limited to the disclosed embodiments. To the contrary, the invention is intended to cover various modifications and equivalent arrangements, included within the spirit and scope of the appended claims. The scope of the following claims is to be accorded the broadest interpretation so as to encompass all such modifications and equivalent structures and functions.

What is claimed is:

1. A solar battery module comprising a plurality of photovoltaic elements, each of said photovoltaic elements comprising a conductive substrate, a photoactive semiconductor layer on said conductive substrate, a transparent conductive layer on said photoactive semiconductor layer, a first output terminal electrically bonded to said transparent conductive layer, and a second output terminal electrically bonded to a conductor of said conductive substrate; the photovoltaic elements being electrically connected in series or parallel by means of metallic members connected to said first and second output terminals, and wherein at least the front, light incident side of each of said photovoltaic elements is covered with a transparent organic polymer resin; and a resin film having a light transmittance of 5% or less for wavelengths ranging from 400 nm to 800 nm is inserted between said metallic members and said transparent organic polymer resin.

2. A solar battery module according to claim 1, wherein the main component of said transparent organic polymer resin comprises butyral resin or ethylene-vinyl acetate copolymer (EVA).

3. A solar battery module according to claim 1, wherein at least the surface of said metallic members comprises a metal selected from the group consisting of copper, silver, solder, nickel, zinc, and tin.

4. A solar battery module according to claim 1, wherein said resin film comprises a resin selected from the group consisting of polyethylene terephthalate (PET), nylon resin, polycarbonate resin, polyethylene, polypropylene, polyvinyl chloride and acrylic resin.

5. A solar battery module according to claim 1, wherein an adhesive resin layer is inserted between said resin film and said metallic members.

6. A solar battery module according to claim 1, wherein a transparent resin film layer is placed in direct contact with the top surface of said transparent organic polymer resin.

7. A solar battery module according to claim 6, wherein said transparent resin film layer is a fluoride polymer.

8. A solar battery module according to claim 7, wherein said fluoride polymer is ethylene-tetrafluoroethylene copolymer.

9. A solar battery module according to claim 1, wherein said photoactive semiconductor layer and said transparent conductive layer formed on the conductive substrate comprise a light for electricity conversion member.

10. A solar battery module according to claim 9, wherein said photoactive semiconductor layer is an amorphous semiconductor thin film.

11. A solar battery module according to claim 10, wherein, said amorphous semiconductor thin film is amorphous silicon.

12. A solar battery module according to claim 1, wherein a filler is disposed between said photovoltaic elements and said transparent organic polymer resin.

13. A solar battery module according to claim 12, wherein said filler is a filler including an ultraviolet absorbing agent.

14. A solar battery module comprising a plurality of photovoltaic elements, each of said photovoltaic elements comprising a conductive substrate, a photoactive semiconductor layer on said conductive substrate, a transparent conductive layer on said photoactive semiconductor layer, a first output terminal electrically bonded to said transparent conductive layer, and a second output terminal electrically bonded to a conductor of said conductive substrate; the photovoltaic elements being electrically connected in series or parallel by means of metallic members connected to said first and second output terminals and wherein at least the front, light incident side of each of said photovoltaic elements is covered with a transparent organic polymer resin; and a black film is inserted between said metallic members and said transparent organic polymer resin.

15. A solar battery module according to claim 14, wherein said black film is a film tape.

16. A solar battery module according to claim 14, wherein adhesive is disposed between said black film and said metallic members.

17. A solar battery module according to claim 14, wherein a filler is disposed between said photovoltaic elements and said transparent organic polymer resin.

18. A solar battery module according to claim 14, wherein said filler is a filler including an ultraviolet absorbing agent.

19. A solar battery module formed by integrally forming a roof sheathing and a solar battery, wherein said solar battery module comprises a plurality of photovoltaic elements, each of said photovoltaic elements comprising a conductive substrate, a photoactive semiconductor layer on said conductive substrate, a transparent conductive layer on said photoactive semiconductor layer, a first output terminal electrically bonded to said transparent conductive layer, and a second output terminal electrically bonded to a conductor of said conductive substrate; the photovoltaic elements being electrically connected in series or parallel by means of metallic members connected to said first and second output terminals, and wherein at least the front, light incident side of each of said photovoltaic elements is covered with a transparent organic polymer resin; and a resin film having a light transmittance of 5% or less for wavelengths ranging from 400 nm to 800 nm is inserted between said metallic members and said transparent organic polymer resin.

20. A solar battery module according to claim 19, wherein a filler is disposed between said photovoltaic elements and said transparent organic polymer resin.

21. A solar battery module according to claim 20, wherein said filler is a filler including an ultraviolet absorbing agent.

22. A solar battery module formed by integrally forming a roof sheathing and a solar battery, wherein said solar battery module comprises a plurality of photovoltaic elements, each of said photovoltaic elements comprising a conductive substrate, a photoactive semiconductor layer on said conductive substrate, a transparent conductive layer on said photoactive semiconductor layer, a first output terminal electrically bonded to said transparent conductive layer, and a second output terminal electrically bonded to a conductor of said conductive substrate; the photovoltaic elements are electrically connected in series or parallel by means of metallic members connected to said first and second output terminals, and wherein at least the front, light incident side of each of said photovoltaic elements is covered with a transparent organic polymer resin; and a black film is inserted between said metallic members and said transparent organic polymer resin.

23. A solar battery module according to claim 22, wherein adhesive is disposed between said black film and said metallic members.

24. A solar battery module according to claim 22, wherein a filler is disposed between said photovoltaic elements and said transparent organic polymer resin.

25. A solar battery module according to claim 24, wherein said filler is a filler including an ultraviolet absorbing agent.

* * * * *

UNITED STATES PATENT AND TRADEMARK OFFICE
CERTIFICATE OF CORRECTION

PATENT NO. : 5,660,646

DATED : August 26, 1997

INVENTOR(S) : ICHIRO KATAOKA ET AL.

Page 1 of 2

It is certified that error appears in the above-identified patent and that said Letters Patent is hereby corrected as shown below:

COLUMN 1

Line 12, "world wide" should read --worldwide--.

COLUMN 2

Line 16, "In" should read --In the--.
    Line 66, "air flow" should read --airflow--.

COLUMN 3

Line 8, "can not" should read --cannot--.

COLUMN 5

Line 1, "poly crystalline" should read --poly-crystalline--.
    Line 3, "CdS/CU$_2$S," should read --CdS/Cu$_2$S,--.
    Line 7, "poly crystalline" should read --poly-crystalline--.

UNITED STATES PATENT AND TRADEMARK OFFICE
CERTIFICATE OF CORRECTION

PATENT NO. : 5,660,646

DATED : August 26, 1997

INVENTOR(S) : ICHIRO KATAOKA ET AL.

It is certified that error appears in the above-identified patent and that said Letters Patent is hereby corrected as shown below:

COLUMN 16

Line 42, "light for electricity" should read
--light-to-electricity--.

Signed and Sealed this

Seventh Day of April, 1998

Attest:

BRUCE LEHMAN

Attesting Officer

Commissioner of Patents and Trademarks